(12) United States Patent
Waite et al.

(10) Patent No.: US 7,723,174 B2
(45) Date of Patent: May 25, 2010

(54) CMOS DEVICE COMPRISING MOS TRANSISTORS WITH RECESSED DRAIN AND SOURCE AREAS AND A SI/GE MATERIAL IN THE DRAIN AND SOURCE AREAS OF THE PMOS TRANSISTOR

(75) Inventors: Andrew Waite, Hopewell Junction, NY (US); Andy Wei, Dresden (DE); Gunter Grasshoff, Radebeul (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/464,161

(22) Filed: May 12, 2009

(65) Prior Publication Data

US 2009/0321843 A1 Dec. 31, 2009

(30) Foreign Application Priority Data

Jun. 30, 2008 (DE) .................. 10 2008 030 850
Sep. 9, 2008 (DE) .................. 10 2008 046 400

(51) Int. Cl.
H01L 21/76 (2006.01)
H01L 21/336 (2006.01)

(52) U.S. Cl. .............. 438/216; 438/289; 438/298; 438/299; 438/300; 438/301; 257/E21.431; 257/E21.633; 257/E21.635

(58) Field of Classification Search .......... 257/E21.431, 257/E21.633, E21.635

See application file for complete search history.

(56) References Cited

U.S. PATENT DOCUMENTS

| 2005/0269650 | A1 | 12/2005 | Pidin ..................... 257/411 |
| 2006/0148181 | A1 | 7/2006 | Chan et al. ............... 438/289 |
| 2007/0238242 | A1 | 10/2007 | Ting et al. ............... 438/230 |
| 2008/0026572 | A1* | 1/2008 | Wirbeleit et al. ........... 438/663 |
| 2008/0054415 | A1* | 3/2008 | Frohberg et al. ........... 257/642 |
| 2009/0321841 | A1* | 12/2009 | Hoentschel et al. ......... 257/369 |

FOREIGN PATENT DOCUMENTS

DE 102006015077 A1 10/2007

OTHER PUBLICATIONS

Translation of Official Communication from German Patent Office for German Patent Application No. 10 2008 046 400.7-33 dated Apr. 16, 2009.
Translation of Official Communication from German Patent Office for German Patent Application No. 10 2008 046 400.7 dated Feb. 19, 2010.

* cited by examiner

*Primary Examiner*—Charles D Garber
*Assistant Examiner*—Mohsen Ahmadi
(74) *Attorney, Agent, or Firm*—Williams, Morgan & Amerson, P.C.

(57) ABSTRACT

The present disclosure relates to semiconductor devices and a process sequence in which a semiconductor alloy, such as silicon/germanium, may be formed in an early manufacturing stage, wherein other performance-increasing mechanisms, such as a recessed drain and source configuration, possibly in combination with high-k dielectrics and metal gates, may be incorporated in an efficient manner while still maintaining a high degree of compatibility with conventional process techniques.

14 Claims, 12 Drawing Sheets

CMOS DEVICE COMPRISING MOS TRANSISTORS WITH RECESSED DRAIN AND SOURCE AREAS AND A SI/GE MATERIAL IN THE DRAIN AND SOURCE AREAS OF THE PMOS TRANSISTOR

BACKGROUND OF THE INVENTION

1. Field of the Invention

Generally, the subject matter disclosed herein relates to integrated circuits, and, more particularly, to high performance transistors having recessed drain and source regions and strained channel regions by using stress sources, such as stressed overlayers, a strained semi-conductor alloy in drain and source areas to enhance charge carrier mobility in the channel region of a MOS transistor.

2. Description of the Related Art

Generally, a plurality of process technologies are currently practiced in the field of semiconductor production, wherein, for complex circuitry, such as microprocessors, advanced storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends, among other things, on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of MOS transistors. Thus, the reduction of the channel length is a dominant design criterion for accomplishing an increase in the operating speed and packing density of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is to provide low sheet and contact resistivity in drain and source regions and any contacts connected thereto and to maintain channel controllability. For example, reducing the channel length may necessitate an increase of the capacitive coupling between the gate electrode and the channel region, which may call for reduced thickness of the gate insulation layer. Presently, the thickness of silicon dioxide based gate insulation layers is in the range of 1-2 nm, wherein a further reduction may be less desirable in view of leakage currents, which typically exponentially increase when reducing the gate dielectric thickness. For this reason, in advanced transistor designs, a high-k dielectric material may be used in the gate dielectric layer, possibly in combination with a metal in the gate electrode, to enhance channel controllability and reduce signal propagation delay caused by a high gate resistivity of conventional gate materials, such as polysilicon in combination with a metal silicide.

The continuous size reduction of the critical dimensions, i.e., the gate length of the transistors, necessitates the adaptation and possibly the new development of highly complex process techniques concerning the above-identified problems. It has, therefore, been proposed to improve transistor performance by enhancing the channel conductivity of the transistor elements by increasing the charge carrier mobility in the channel region for a given channel length, thereby offering the potential for achieving a performance improvement that is comparable with the advance to a future technology node, while avoiding or at least postponing many of the above-mentioned problems, or achieving further increased performance when combined with other performance enhancing techniques, such as high-k gate dielectrics and the like. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, for standard silicon substrates, creating tensile strain in the channel region increases the mobility of electrons, which in turn may directly translate into a corresponding increase in the conductivity and thus drive current and operating speed. On the other hand, compressive strain in the channel region may increase the mobility of holes, thereby providing the potential for enhancing the performance of P-type transistors. The introduction of stress or strain engineering into integrated circuit fabrication is an extremely promising approach, since, for example, strained silicon may be considered as a "new" type of semiconductor material, which may enable the fabrication of fast powerful semiconductor devices without requiring expensive semiconductor materials, while many of the well-established manufacturing techniques may still be used.

According to one promising approach for creating strain in the channel region of transistor elements, the dielectric material that is formed above the basic transistor structure may be provided in a highly stressed state so as to induce a desired type of strain at the transistor and in particular in the channel region thereof. For example, the transistor structures are typically embedded in an interlayer dielectric material, which may provide the desired mechanical and electrical integrity of the individual transistor structures and which may provide a platform for the formation of additional wiring layers, which are typically required for providing the electrical interconnections between the individual circuit elements. That is, a plurality of wiring levels or metallization layers may typically be provided which may include horizontal metal lines and vertical vias including appropriate conductive materials for establishing the electrical connections. Consequently, an appropriate contact structure has to be provided which connects the actual circuit elements, such as transistors, capacitors and the like, or respective portions thereof, with the very first metallization layer. For this purpose, the interlayer dielectric material has to be appropriately patterned in order to provide respective openings connecting to the desired contact areas of the circuit elements, which may typically be accomplished by using an etch stop material in combination with the actual interlayer dielectric material.

For example, silicon dioxide is a well-established interlayer dielectric material in combination with silicon nitride, which may act as an efficient etch stop material during the formation of the contact openings. Consequently, the etch stop material, i.e., the silicon nitride material, is in close contact with the basic transistor structure and thus may be efficiently used for inducing strain in the transistors, in particular as silicon nitride may be deposited on the basis of well-established plasma enhanced chemical vapor deposition (PECVD) techniques with high internal stress. For instance, silicon nitride may be deposited with high internal compressive stress of up to 2 GPa and even higher by selecting appropriate deposition parameters. On the other hand, a moderately high internal tensile stress level may be created up to 1 GPa and higher by appropriately adjusting the process parameters, for instance, in particular the degree of ion bombardment during the deposition of the silicon nitride material. Consequently, the magnitude of the strain created in the channel region of a transistor element may depend on the internal stress level of the dielectric etch stop material and the thickness of stressed dielectric material in combination with the effective offset of the highly stressed dielectric material with respect to the channel region. Consequently, in view of enhancing transistor performance, it may be desirable to increase the internal stress level and also provide increased amounts of highly stressed dielectric material in the vicinity of the transistor element, while also positioning the stressed dielectric material as closely as possible to the channel region.

It turns out, however, that the internal stress levels of silicon nitride material may be restricted by the overall deposition capabilities of presently available PECVD techniques, while the effective layer thickness may also be substantially determined by the basic transistor topography and the distance between neighboring circuit elements. Consequently, although providing significant advantages, the efficiency of the stress transfer mechanism may depend significantly on process and device specifics and may result in reduced performance gain for well-established standard transistor designs having gate lengths of 50 nm and less, since the given device topography and the gap fill capabilities of the respective deposition process, in combination with a moderately high offset of the highly stressed material from the channel region caused by sophisticated spacer structures, may reduce the finally obtained strain in the channel region.

For these reasons, it has been suggested to use a recessed transistor architecture, i.e., an architecture in which portions of drain and source regions are recessed with respect to the channel region in the vicinity of the interface between the channel and the gate insulation layer in order to allow the deposition of the highly stressed dielectric material at a height level that corresponds to the channel region, thereby efficiently enhancing the lateral stress transfer mechanism into the channel region. This mechanism may be completed, for example, in some approaches with respect to enhancing performance of P-channel transistors, by providing a semiconductor material at least in portions of the drain and source areas in such a manner that a desired type of strain may be generated in the adjacent channel region. For this purpose, frequently, a silicon/germanium mixture or alloy may be used which may be epitaxially grown on a silicon template material, thereby creating a strained state of the silicon/germanium alloy, which may exert a certain stress on the adjacent channel region, thereby creating the desired type of strain therein. The magnitude of the strain in the channel region may be adjusted on the basis of the size of respective cavities in which the silicon/germanium alloy may be grown and by the amount of the germanium concentration in the semiconductor alloy. Since the respective strained semiconductor alloy may be positioned immediately adjacent to the channel region, a highly efficient strain-inducing mechanism may be provided. However, this strain-inducing mechanism may be difficult to be integrated into a process flow for providing a recessed transistor configuration, when the semiconductor alloy is provided in an early state of the process flow. That is, the process steps required for recessing the drain and source regions may affect other transistor components, such as the gate electrodes, the metal silicide regions that are typically to be formed on the drain and source regions and the like. Furthermore, the incorporation of sophisticated gate structures on the basis of high-k dielectrics and metal-containing electrode materials may also contribute to increased process complexity in combination with a recessed transistor configuration. However, in principle, each of these mechanisms may contribute to enhanced device performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and techniques for fabricating the same wherein enhanced transistor performance may be obtained for a transistor on the basis of a recessed transistor configuration, in combination with the incorporation of a strain-inducing semiconductor alloy at an early manufacturing stage. For this purpose, a technique may be provided which may maintain a high degree of compatibility with sophisticated CMOS technologies, in which a strained semiconductor alloy, such as strained silicon/germanium material, may be provided in the drain and source areas of P-channel transistors, while, in a later manufacturing stage, additional strain-inducing mechanisms may be implemented in the form of strain-inducing cap layers, the strain-inducing effect of which may be enhanced by providing recessed transistor configuration for N-channel transistors and P-channel transistors. To this end, an appropriate system of etch stop or cap layers in gate electrode structures may be provided in order to provide a high degree of compatibility with established manufacturing processes, such as the incorporation of drain and source areas while using the gate electrode structure as an efficient implantation mask, the height of which may be reduced in a later stage on the basis of respective cap or etch stop layers, while also enabling the formation of respective recesses in the drain and source areas. In some illustrative embodiments, the configuration of etch stop cap layers provided in the gate electrode structure may incorporate highly sophisticated techniques, such as high-k dielectric materials as gate dielectric in combination with metal-containing electrode materials, which may be provided in a very advanced stage after completing the basic transistor structure. Consequently, a plurality of performance enhancing mechanisms may be implemented into a highly efficient overall process flow.

One illustrative semiconductor device disclosed herein comprises a transistor formed above a substrate and comprising drain and source regions which include a strain-inducing semiconductor alloy. The drain and source regions further comprise metal silicide regions having a recessed surface portion that is positioned at a lower height level compared to a height level defined by a surface of a gate insulation layer that separates a gate electrode from a channel region of the transistor. The semiconductor device further comprises a strain-inducing layer formed above the drain and source regions, wherein the strain-inducing layer and the strain-inducing semiconductor alloy create the same type of strain in the channel region.

One illustrative method disclosed herein comprises forming a gate electrode structure above a silicon-containing semiconductor region, wherein the gate electrode structure comprises a cap layer, a first etch stop layer located below the cap layer and a second etch stop layer located below the first etch stop layer. The method further comprises forming a strain-inducing semiconductor alloy in recesses in the silicon-containing semiconductor region laterally offset from the gate electrode structure. Furthermore, drain and source regions are formed in the semiconductor region and the semiconductor alloy. Furthermore, the method comprises removing material of the silicon-containing semiconductor region and of the gate electrode structure so as to recess the drain and source regions and reduce a height of the gate electrode structure while using the second etch stop layer as an etch stop. Furthermore, a strain-inducing layer is formed above the drain and source regions.

Another illustrative method disclosed herein comprises forming drain and source regions of a first transistor in a semiconductor layer adjacent to a first gate electrode having formed on sidewalls thereof a first spacer structure, wherein the drain and source regions of the first transistor comprise a strain-inducing semiconductor alloy. The method further comprises forming drain and source regions of a second transistor adjacent to a second gate electrode having formed on sidewalls thereof a second spacer structure. The method additionally comprises forming recesses in the drain and source regions of the first and second transistors and removing a portion of the first and second gate electrodes in a common etch process. Finally, the method comprises forming a first strain-inducing material above the drain and source regions of the first transistor and forming a second strain-inducing material above the drain and source regions of the second transistor, wherein the first and second strain-inducing materials generate a different type of strain.

BRIEF DESCRIPTION OF THE DRAWINGS

The disclosure may be understood by reference to the following description taken in conjunction with the accompanying drawings, in which like reference numerals identify like elements, and in which:

FIGS. 1i-1l schematically illustrate cross-sectional views of the semiconductor device as shown in FIGS. 1a-1f when the basic transistor structure is provided by using high-k dielectric materials for the gate insulation layer and appropriate metal-containing electrode materials, according to further illustrative embodiments.

Figure 1A:
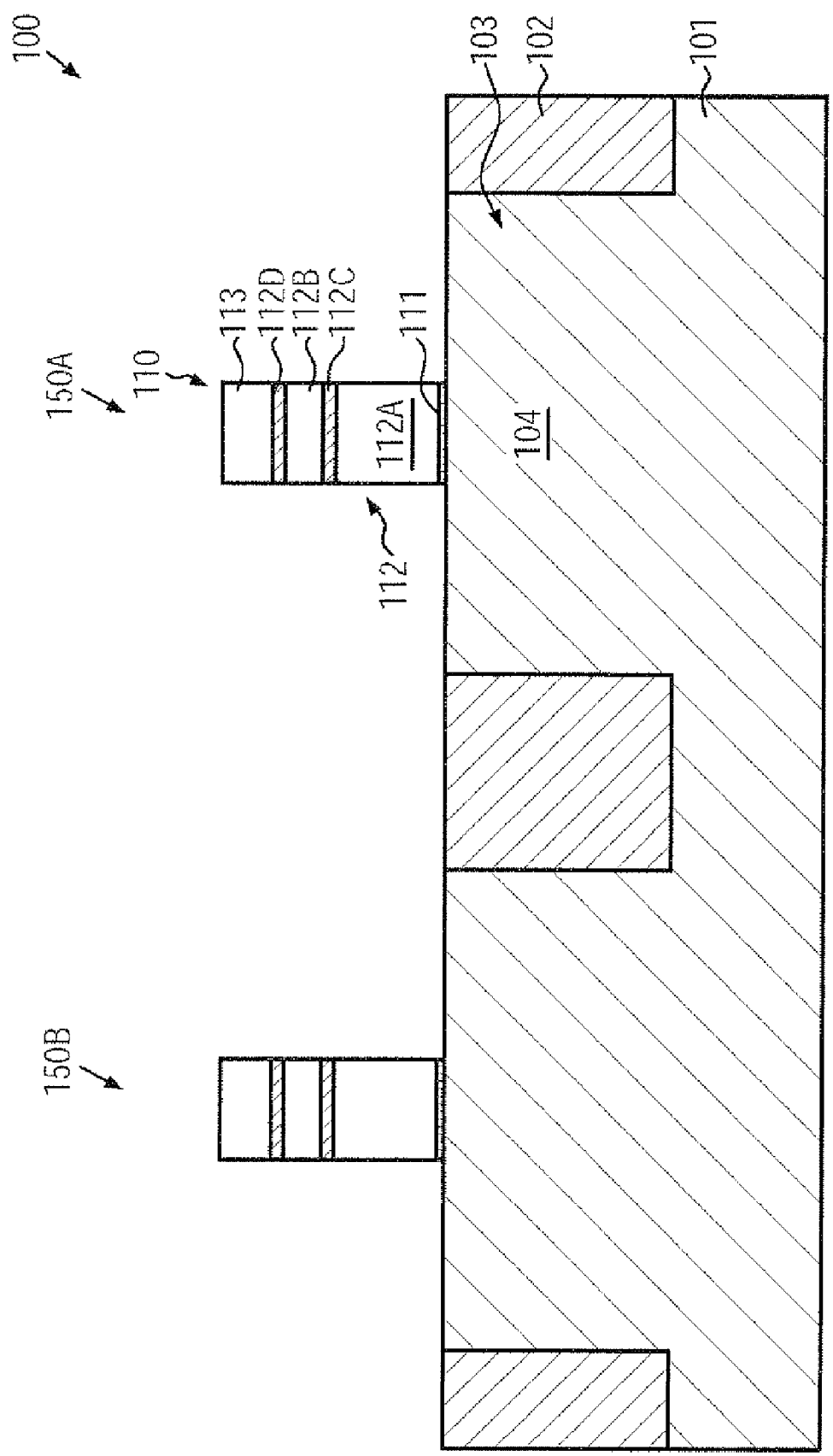
FIGS. 1a-1f schematically illustrate cross-sectional views of a semiconductor device comprising an N-channel transistor and a P-channel transistor during various manufacturing stages in forming a semiconductor alloy in the P-channel transistor and recessing the drain and source areas of both transistors, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and process techniques for combining a plurality of performance-enhancing mechanisms while nevertheless maintaining a highly efficient overall process flow with a high degree of flexibility and compatibility with well-established process techniques. For this purpose, a recessed transistor configuration, i.e., a transistor configuration in which an upper surface of drain and source regions may be positioned at a lower height level compared to the gate dielectric material, may be provided in combination with a strain-inducing semiconductor alloy, at least in one type of transistor, which may be provided in an early manufacturing stage, according to well-established process techniques. Furthermore, the semiconductor devices and techniques disclosed herein may also enable the incorporation of sophisticated gate electrode structures, for instance comprising high-k dielectric materials in combination with metal-containing electrode materials, wherein sophisticated gate electrode structures may be concurrently provided with polycrystalline silicon-based gate electrodes, if desired, wherein a corresponding manufacturing sequence for providing the sophisticated gate electrode structures may be compatible with the presence of strain-inducing semiconductor alloys. In some illustrative aspects disclosed herein, an appropriately configured gate electrode structure may be formed which may comprise an appropriate cap layer and intermediate dielectric layers or etch stop layers, which may enable an efficient process flow for incorporating the strain-inducing semiconductor alloy and forming appropriate recesses in the drain and source regions in a later manufacturing stage, in combination with providing metal silicide according to conventional process techniques, while also enabling a replacement of the initial gate electrode material with a metal-containing material, possibly in combination with a high-k dielectric material.

In addition, the cap layer on top of the gate electrode structure may enable an increase of the implantation energies of corresponding ion implantation processes to be performed to form halo regions, i.e., counter-doped regions, and the drain and source regions, wherein the appropriate thickness of the cap layer prevents penetration of the implant species in the gate dielectric and the channel region of the transistor. Since the "disposable" cap layer is removed in a later stage, the height of the gate electrode, for instance a polysilicon gate electrode, is reduced, thereby also reducing the parasitic capacitance between the gate electrode and the contact element, extending through the contact level of the transistor and the drain and source regions. Moreover, the reduced height of the gate electrode may enable the provision of any stress-inducing overlayers with increased thickness and thus enhanced efficiency with respect to creating strain in the channel region.

Consequently, the advantages of a recessed transistor configuration, i.e., the positioning of a highly stressed dielectric material closer to the channel region of the transistors, even if a reduced layer thickness in other device regions may be required for the highly stressed dielectric material due to restricted conformal deposition capabilities of the corresponding plasma enhanced deposition processes, may be maintained, while also a strain-inducing semiconductor alloy may be positioned adjacent to the channel region of at least one type of transistor, thereby even further enhancing the overall strain-inducing mechanism. Thus, even for sophisticated transistor geometries, which may require the deposition of a reduced amount of highly stressed dielectric material, the actual amount of dielectric material positioned in close proximity to the channel region at a height level that substantially corresponds to the height level of the channel region may be increased, which, in combination with the generally enhanced lateral stress transfer, may provide a higher strain in the channel region, thereby contributing to enhanced charge carrier mobility and thus drive current capability of the transistors under consideration. Furthermore, the recessed drain and source configurations in N-channel transistors and P-channel transistors may also provide an increased surface area that is available in a silicidation process, which may therefore result in a reduced sheet resistance of the contact areas of the corresponding transistors. In addition, in some illustrative embodiments, any constraints imposed on the silicidation of the drain and source regions and on the silicidation process of the gate electrode structure may be over-come by replacing the initial gate electrode material by any appropriate metal-containing material, thereby significantly enhancing the overall gate resistivity, while an enhancement with respect to the capacitive coupling of the gate electrode to the channel region may also be accomplished by using high-k dielectric materials, which are to be understood as dielectric materials having a dielectric constant of approximately 10 or higher. For example, materials such as tantalum oxide ($Ta_2O_5$) with a k of approximately 25, strontium titanium oxide ($SrTiO_3$) having a k of approximately 150, hafnium oxide ($HfO_2$), hafnium silicon oxide (HfSiO), zirconium oxide ($ZrO_2$) and the like, may be used as appropriate insulation layers and, in some illustrative embodiments, also as efficient stop or mask layers located in the initially provided gate electrode structure in order to obtain an enhanced etch stop capability. Thus, by providing a high-k dielectric material for the gate insulation layers in combination with highly conductive non-polysilicon materials, such as titanium nitride and the like, its performance may be enhanced since a depletion zone, which may typically occur in polysilicon gate electrode structures, may be avoided by positioning the silicon-containing material directly on the high-k dielectric material. In some illustrative embodiments, sophisticated gate electrode structures may be provided selectively for performance transistors, while, in other device areas, such as memory areas and the like, well-established polysilicon electrode structures on the basis of polysilicon and metal silicide may be maintained, while nevertheless providing a recessed transistor configuration in combination with strain-inducing semiconductor alloys.

FIG. 1a schematically illustrates a cross-sectional view of a semiconductor device 100 comprising a substrate 101, above which may be formed a silicon-containing semiconductor layer 103. The substrate 101 may represent any appropriate carrier material for forming thereabove the semiconductor layer 103, wherein, depending on the overall device requirements locally or globally across the substrate 101, a buried insulating layer (not shown) may be provided below the semiconductor layer 103, thereby defining a silicon-on-insulator (SOI) configuration. In other cases, the semiconductor layer 103 may represent a portion of a substantially crystalline material of the substrate 101. Moreover, trench isolation structures 102, such as shallow trench isolations, may be provided such that respective "active" areas may be defined in the semiconductor layer 103. An active semiconductor area may be considered as a semiconductor region in the layer 103 in which an appropriate dopant profile is to be established so as to obtain at least one PN junction. In the illustrative embodiment shown in FIG. 1a, the semiconductor layer 103 may be divided by the isolation structures 102 such that a first transistor 150A and a second transistor 150B may be provided in an early manufacturing stage. That is, the first and second transistors 150A, 150B may comprise, in this manufacturing stage, a gate electrode structure 110 comprising a gate insulation layer 111 that is formed on a portion of the semiconductor layer 103, which may also be referred to as a channel region 104. It should be appreciated that a gate insulation layer 111 may also be formed on dielectric portions of corresponding isolation structures 102, since typically the gate electrode structure 110 may extend in the transistor width direction, i.e., in FIG. 1a, the direction perpendicular to the drawing plane beyond a semiconductor region enclosed by the isolation structure 102. The gate insulation layer 111 may, in some illustrative embodiments, be provided in the form of a conventional dielectric material, i.e., a silicon dioxide-based material, possibly including nitrogen, while, in other cases, a high-k dielectric material may be used, for instance in the form of one or more of the materials described above. The high-k dielectric material may be provided in combination with a very thin conventional dielectric material, such as silicon dioxide and the like, if considered appropriate. In still other illustrative embodiments, the gate insulation layer 111 may be partially or completely placed with a high-k dielectric material in a later manufacturing stage.

Furthermore, the gate electrode structure 110 may comprise a gate electrode 112, which may be comprised of conductive material, such as polycrystalline silicon, in the form of respective portions 112A, 112B, which may be separated by a dielectric material etch stop layer 112C. For example, the intermediate dielectric layer 112C may be provided in the form of silicon dioxide or any other appropriate material providing the desired etch stop and masking capabilities in a later manufacturing stage. In other illustrative embodiments, the intermediate dielectric layer 112C may comprise a high-k dielectric material, such as hafnium oxide, which may exhibit a high etch resistivity with respect to a plurality of well-established etch recipes, such as fluoric acid (HF) and the like. Moreover, the gate electrode 112 may comprise a further etch stop or cap layer 112D, which may be comprised of silicon dioxide and the like, and which may provide etch stop capabilities with respect to a cap layer 113 of the gate electrode structure 110, which may be provided in the form of a silicon nitride material. It should be appreciated, however, that any other appropriate material may be selected for the layers 112D and the cap layer 113, as long as the cap layer 113 may be selectively removed with respect to the layer 112D during the further processing, as will be described later on in more detail. Furthermore, in other illustrative embodiments, the gate electrode 112 may be provided without the layer 112D when the etch selectivity of portion 112B with respect to the cap layer 113 is considered appropriate during the further processing. It should be appreciated that the gate electrode 112 may be provided with a height which may provide the desired ion blocking effect when performing implantation processes for defining the drain and source areas for the transistors 150A, 150B.

The semiconductor device 100 as shown in FIG. 1*a* may be formed on the basis of the following processes. Prior to or after forming the isolation structures 102, which may include sophisticated lithography techniques, etch processes, deposition processes, memorization techniques and the like, using well-established recipes, an appropriately based dopant profile may be established for the transistors 150A, 150B. For instance, the transistor 150A may represent a P-channel transistor and may thus receive a basic N-doping in order to adjust basic transistor characteristics. Similarly, the transistor 150B may receive a basic P-doping when representing an N-channel transistor. Next, material of the gate insulation layer 111 may be formed, for instance, by oxidation and respective treatments, deposition and the like, depending on the desired material composition of the layer 111. Thereafter, material for the gate electrode 112, i.e., the portion 112A, may be formed, for instance, by depositing a polycrystalline silicon material on the basis of well-established chemical vapor deposition (CVD) techniques, such as low pressure CVD and the like. Thereafter, the intermediate dielectric material 112C may be formed, for instance, by oxidation, deposition and the like, depending on the overall process strategy. For example, when providing a silicon dioxide material, well-established deposition recipes may be used. Similarly, a high-k dielectric material may be deposited, such as hafnium oxide, if enhanced etch stop capabilities may be required. Next, the material for the portion 112B may be deposited, followed by a deposition, oxidation and the like in order to form the cap layer or etch stop layer 112D. Thereafter, material of the cap layer 113, for instance in the form of a silicon nitride material, may be deposited. Furthermore, if required, the cap layer 113 may comprise additional materials to obtain a desired anti-reflective coating (ARC) stack, if considered appropriate. Thereafter, sophisticated lithography techniques may be used to form a resist mask which may be used for patterning at least the cap layer 113, wherein, if required, the layer 112D may be used as an etch stop material. Thereafter, the patterning of the gate electrode 112 may be formed by using well-established recipes, wherein, however, etched process control may be obtained by the intermediate etch stop layer 112C, since first the portion 112B may be patterned and thereafter the intermediate layer 112C may be opened and then the portion 112A may be etched.

Figure 1B:
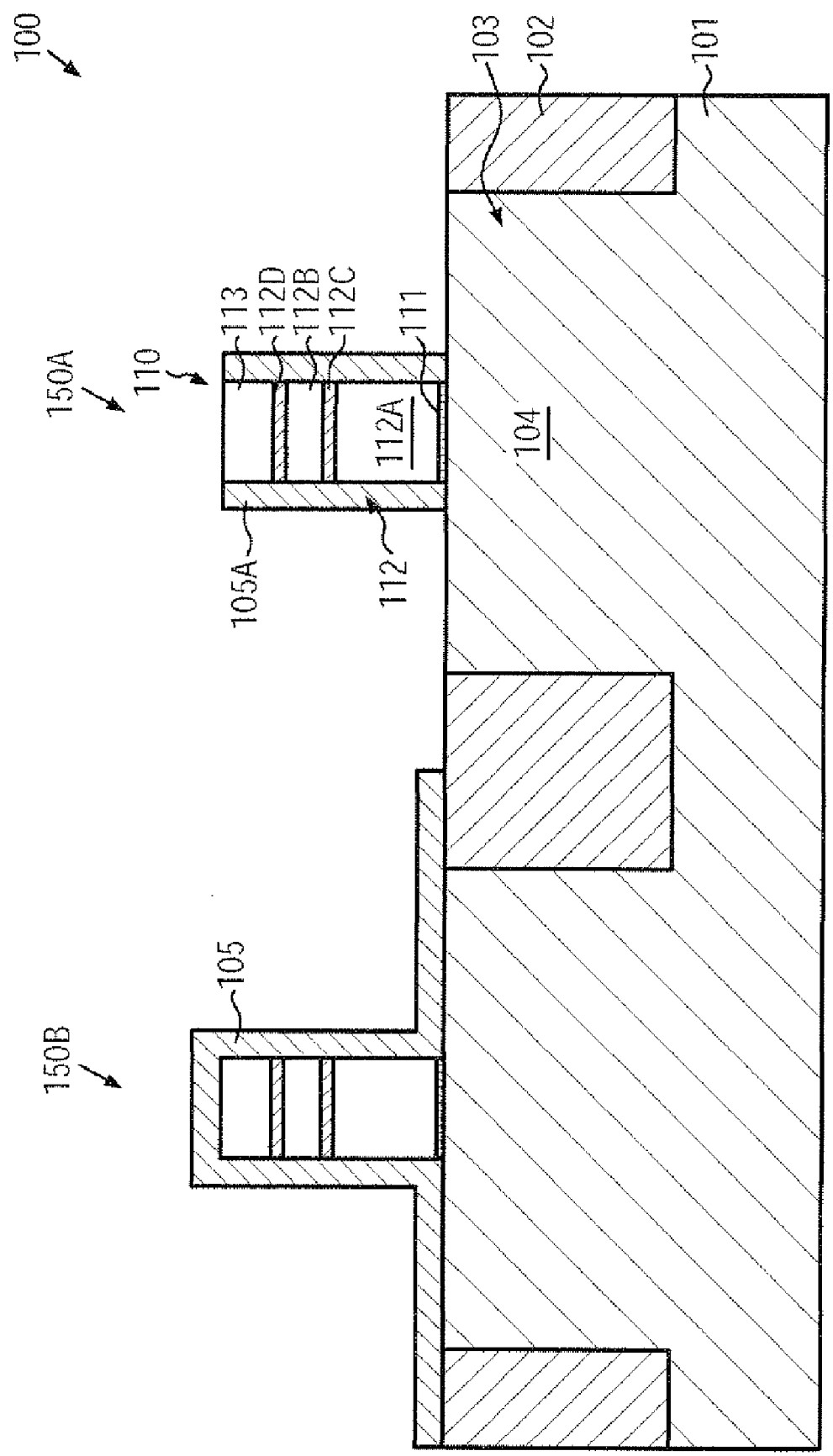

FIG. 1*b* schematically illustrates the semiconductor device 100 in a further advanced manufacturing stage in which a mask layer 105, for instance comprised of silicon nitride, may be formed above the second transistor 150B, while a spacer element 105A may be formed on sidewalls of the gate electrode structure 110, thereby covering exposed sidewall portions of a gate electrode 112. The device 100 as shown in FIG. 1*b* may be formed by depositing the mask layer 105 above the first and second transistors 150A, 150B and subsequently masking the transistor 150B, for instance by a resist material, while exposing the device 100 to an anisotropic etch ambient for selectively removing material of the mask layer 105 from horizontal device portions, thereby forming the spacer element 105A.

Figure 1C:
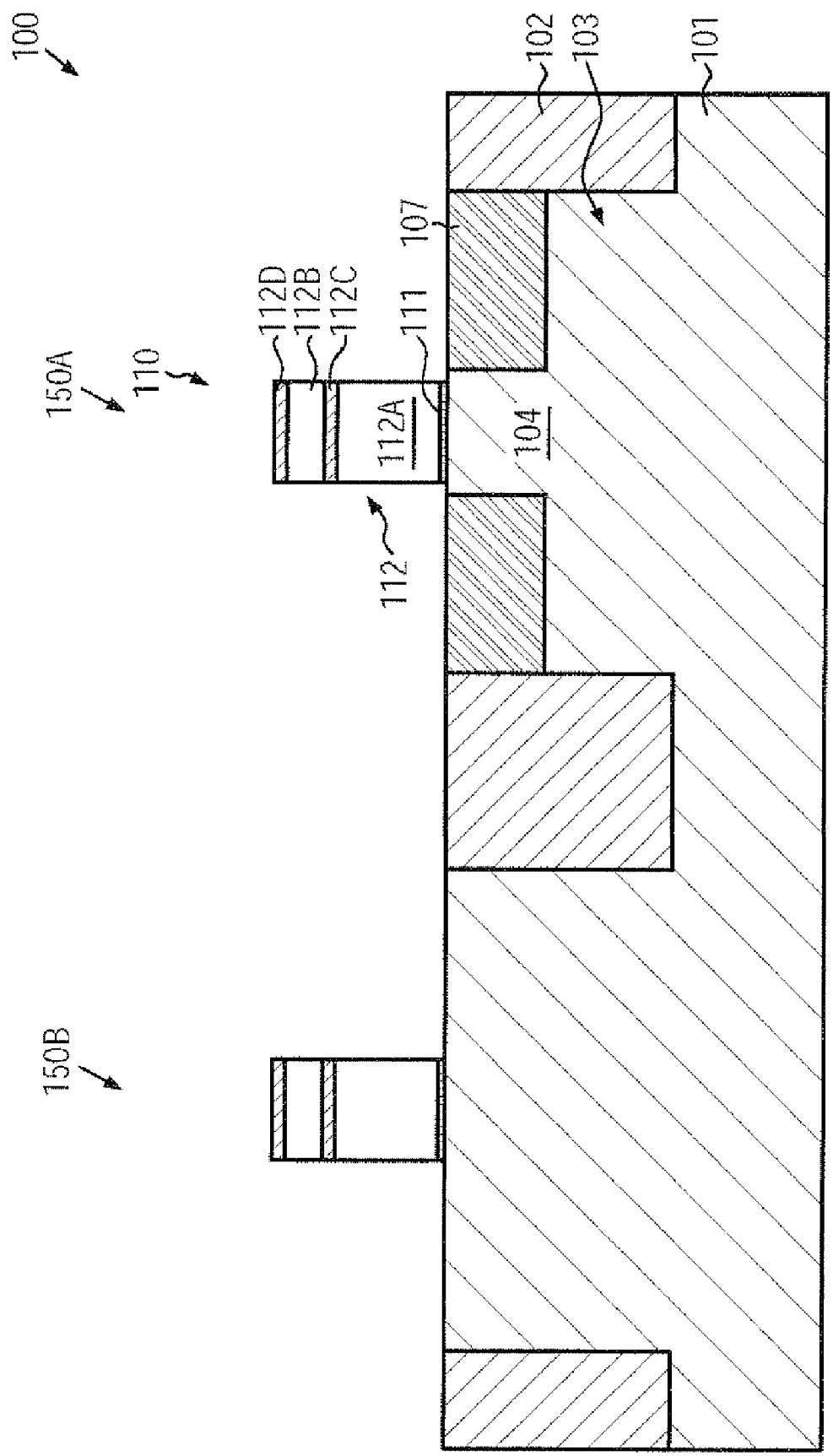

FIG. 1*c* schematically illustrates the semiconductor device 100 in a further advanced manufacturing stage. As illustrated, the transistor 150A may comprise a semiconductor alloy 107 formed within the semiconductor layer 103, wherein the semiconductor alloy 107 may represent a strain-inducing material, for instance in the form of silicon/germanium, silicon/germanium/tin, silicon/tin and the like. In this case, the strain-inducing semiconductor alloy 107 may adopt substantially the same crystalline structure and thus lattice constant relative to the surrounding silicon-containing material of the layer 103, which may result in a strained state of the material 107, since its natural lattice constant may be greater compared to the lattice constant of the base material of the layer 103. For example, depending on the concentration of the species having the increased covalent radius, a respective pronounced increase of the natural lattice constant may be achieved, thereby providing increased deformed state of the material 107, which in turn results in a respective compressive strain in the channel region 104. In other illustrative embodiments, the semi-conductor alloy 107 may be comprised of a material composition having a natural lattice constant that is smaller than that of the surrounding material of the layer 103, thereby creating a tensile strain component in the channel region 104. In still other illustrative embodiments, an appropriate semiconductor alloy may be provided in the transistor 150B so as to also enhance performance thereof by creating a respective strain therein.

The semiconductor device 100 as shown in FIG. 1*c* may be formed on the basis of the following processes. After providing the mask layer 105 and the spacer element 105A (FIG. 1*b*), the device 100 may be exposed to an appropriate etch ambient for removing material of exposed portions of the layer 103 for the transistor 150A. It should be appreciated that the mask layer 105 may also be provided in the form of a spacer element for the transistor 150B if respective recesses or cavities may also be desired for the transistor 150B. The corresponding etch process may be performed on the basis of well-established process recipes, wherein the size and shape of the corresponding cavities may be adjusted on the basis of the etch parameters. That is, the degree of directionality of the etch process may be adjusted on the basis of well-established parameters, while also a depth of the corresponding cavities may be adjusted on the basis of the etch time for a given parameter setting. Consequently, an offset of the cavity with respect to the gate electrode 112 may be adjusted on the basis of the width of the spacer element 105A and the selection of the etch parameters. After the etch process, exposed surface portions of the layer 103 in the transistor 150A may be prepared for a selective epitaxial growth process, which may then be performed on the basis of well-established process parameters in order to deposit the semiconductor alloy 107. During the epitaxial growth process, a significant deposition of the material 107 on dielectric surface portions may be suppressed, while the material 107 may grow within the recesses, thereby adopting the lattice constant of the remaining material of the layer 103, which may act as a growth template. After the growth of the semiconductor alloy 107, the mask layer 105, the spacer 105A and the cap layers 113 (see FIG. 1b) may be removed, for instance, on the basis of hot phosphoric acid, if these materials are comprised of silicon nitride. In other cases, any other appropriate selective etch recipe may be used so as to not unduly affect the semiconductor alloy 107 when removing these components.

Figure 1D:
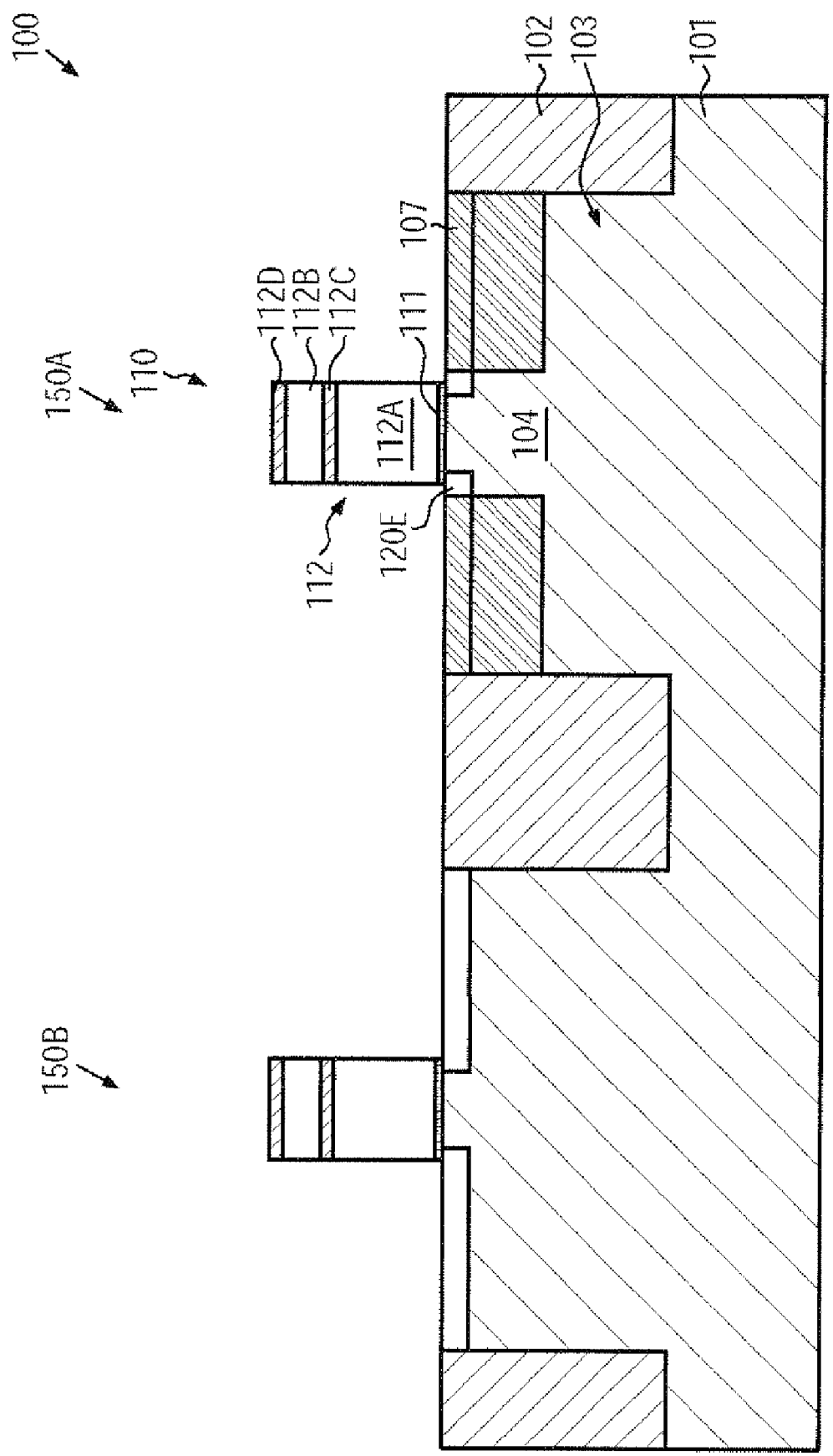

FIG. 1d schematically illustrates the semiconductor device 100 in a further advanced stage in which extension regions 120E may be formed adjacent to the gate electrodes 112. For this purpose, appropriate masking regimes may be used so as to selectively introduce an appropriate dopant species into the first and second transistors 150A, 150B. Furthermore, a respective implantation sequence may include the creation of halo regions (not shown) which are typically formed by ion implantation, in order to introduce a dopant species whose conductivity type corresponds to the conductivity type of the remaining channel and semiconductor region so as to adjust the dopant gradient at the resulting PN junction. In this way, the controllability of the channel region 104 may be enhanced, while also reducing any variance of the threshold voltage of the transistors 150A, 150B, which may also be determined by the work function of the electrode material of the gate electrode 112, which, in some illustrative embodiments, may be replaced by an appropriately selected metal-containing material, as will be described later on. It should further be appreciated that an offset spacer element (not shown) may be formed on sidewalls of the gate electrode 112 in order to appropriately adjust the entry point of the corresponding dopant species.

In some illustrative embodiments, the portion 112B, in combination with the portions 112C and 112D, may act as a cap layer on top of the gate electrode structure 112, which may allow an increase of the implantation energies of corresponding ion implantation processes to be performed to form halo regions, i.e., counter-doped regions, and the drain and source regions, such as the extension 120E. Thus, the thickness of the portions 112B, 112C, 112D may be selected to provide the required ion blocking capability with respect to the desired implantation energies, which may thus enable enhanced overall implantation conditions by avoiding extremely low energies as may be required in conventional strategies. Since the "disposable" cap layer, i.e., the portions 112B, 112C, 112D, is removed in a later stage, the final height of the gate electrode, for instance in the form of a polysilicon gate electrode, may be reduced, thereby also reducing the parasitic capacitance between the gate electrode and a contact element to be formed so as to extend through a contact level of the device 100 and to connect to drain and source regions still to be formed. Moreover, the reduced height of the gate electrode may enable the provision of any stress-inducing overlayers with increased thickness and thus enhanced efficiency with respect to creating strain in the channel region.

Figure 1E:
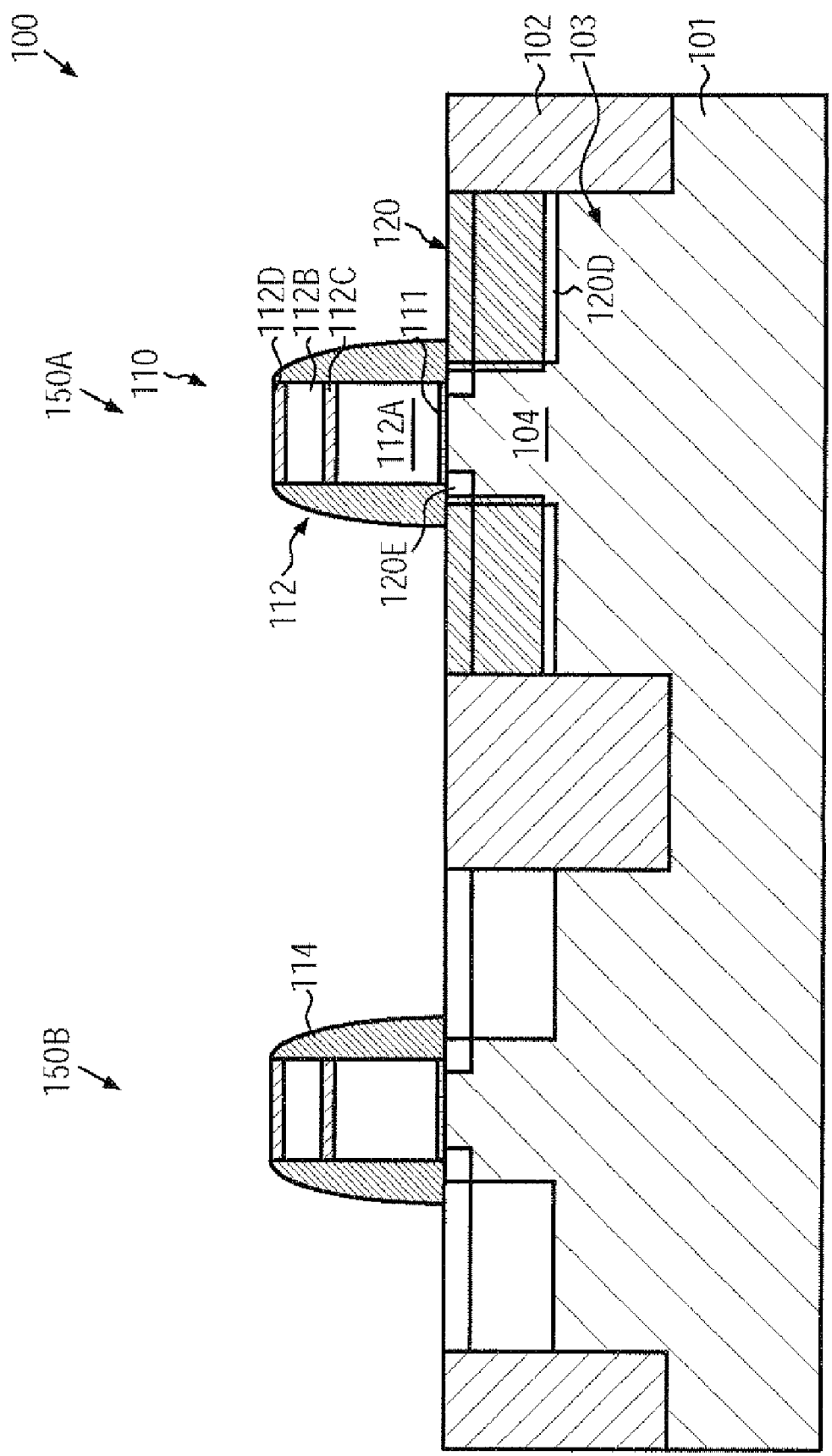

FIG. 1e schematically illustrates the device 100 in a further advanced manufacturing stage. As illustrated, a spacer structure 114 may be formed on sidewalls of the gate electrode 112 and may have any appropriate configuration as is required for defining a desired lateral dopant profile for drain and source regions 120. For example, the extension regions 120E previously formed may define, in combination with deep drain and source regions 120D, the desired dopant profile for the drain and source regions 120. For this purpose, the spacer structure 114 may be provided in the form of a single spacer element, possibly in combination with an etch stop liner (not shown) which may act as an implantation mask in order to define the offset of the deep drain and source region 120D with respect to the gate electrode 112. In other cases, the spacer structure 114 may include two or more individual spacer elements, possibly in combination with respective etch stop liners, wherein each of the corresponding spacer elements may be used as an implantation mask prior to forming a further spacer element. During a respective implantation sequence for forming the drain and source regions 120, the gate electrode 112 may also act as an implantation mask where its initial height may be substantially maintained, thereby substantially avoiding undue penetration of the dopant species into the channel region 104, as explained above. Next, appropriate anneal processes may be performed in order to activate the dopants and reduce implantation-induced damage. Furthermore, during a corresponding anneal sequence, he final dopant profile may also be adjusted, since a more or less pronounced degree of dopant diffusion may take place, depending on the anneal technique used.

Figure 1F:
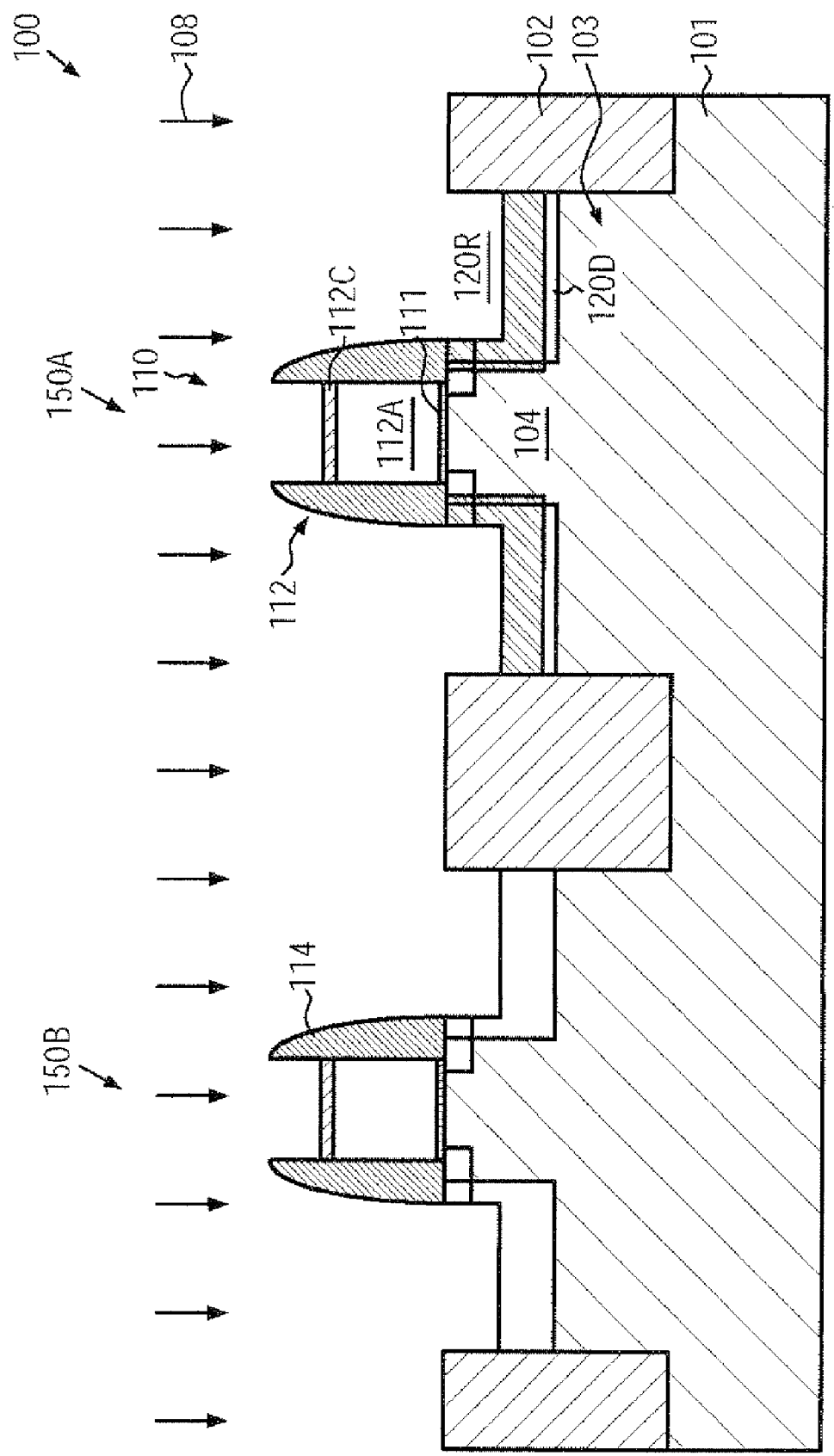

FIG. 1f schematically illustrates the semiconductor device 100 during an etch sequence 108 for removing material of the drain and source regions 120 in order to create corresponding recesses 120R therein. Furthermore, in the embodiment illustrated in FIG. 1f, material of the gate electrode 112 may also be removed, i.e., the portion 112B (FIG. 1e) may be removed to reduce the height of the gate electrode 112. For this purpose, the etch sequence 108 may comprise a first etch step for etching through the dielectric layer 112D (FIG. 1e), possibly in combination with etching through an etch stop liner which may have been provided during the formation of the spacer structure 114. Next, material including a high silicon concentration may be selectively removed to dielectric areas of the device on the basis of a plasma assisted etch process, for instance using hydrogen bromide (HBr). During the etch process 108, the depth of the recesses 120R may be adjusted on the basis of the etch time of the process 108, while a desired reduction in height of the gate electrode 112 may be independently adjusted on the basis of the intermediate etch stop layer 112C. That is, as long as the desired reduction in height of the gate electrode 112 is less than a desired depth of the recesses 120R, an efficient decoupling of the height reduction and the size of the recesses 120R may be obtained on the basis of the intermediate layer 112C. In some illustrative embodiments, enhanced etch resistivity of the layer 112C during the etch process 108 may be achieved by providing the layer 112C as a high-k dielectric material, such as hafnium oxide, which may exhibit etch stop capabilities compared to a silicon dioxide layer of the same thickness. It should be appreciated that an offset of the recesses 120R from the gate electrode 112 may be substantially determined by the width of the spacer structure 114 if a highly anisotropic etch behavior may be used during the process 108. In other illustrative embodiments, if a certain degree of under-etching may be desirable in view of more closely positioning a metal silicide and a highly stressed dielectric material to the channel region 104, respective process parameters of the plasma assisted etch process may be adjusted and/or a wet chemical isotropic etch process may be included into the sequence 108. In still other illustrative embodiments, the width of the spacer structure 114 may be adjusted prior to performing the etch sequence 108, for instance by removing one or more spacer elements of the structure 114, for example by using respective etch stop liners (not shown).

Figure 1G:
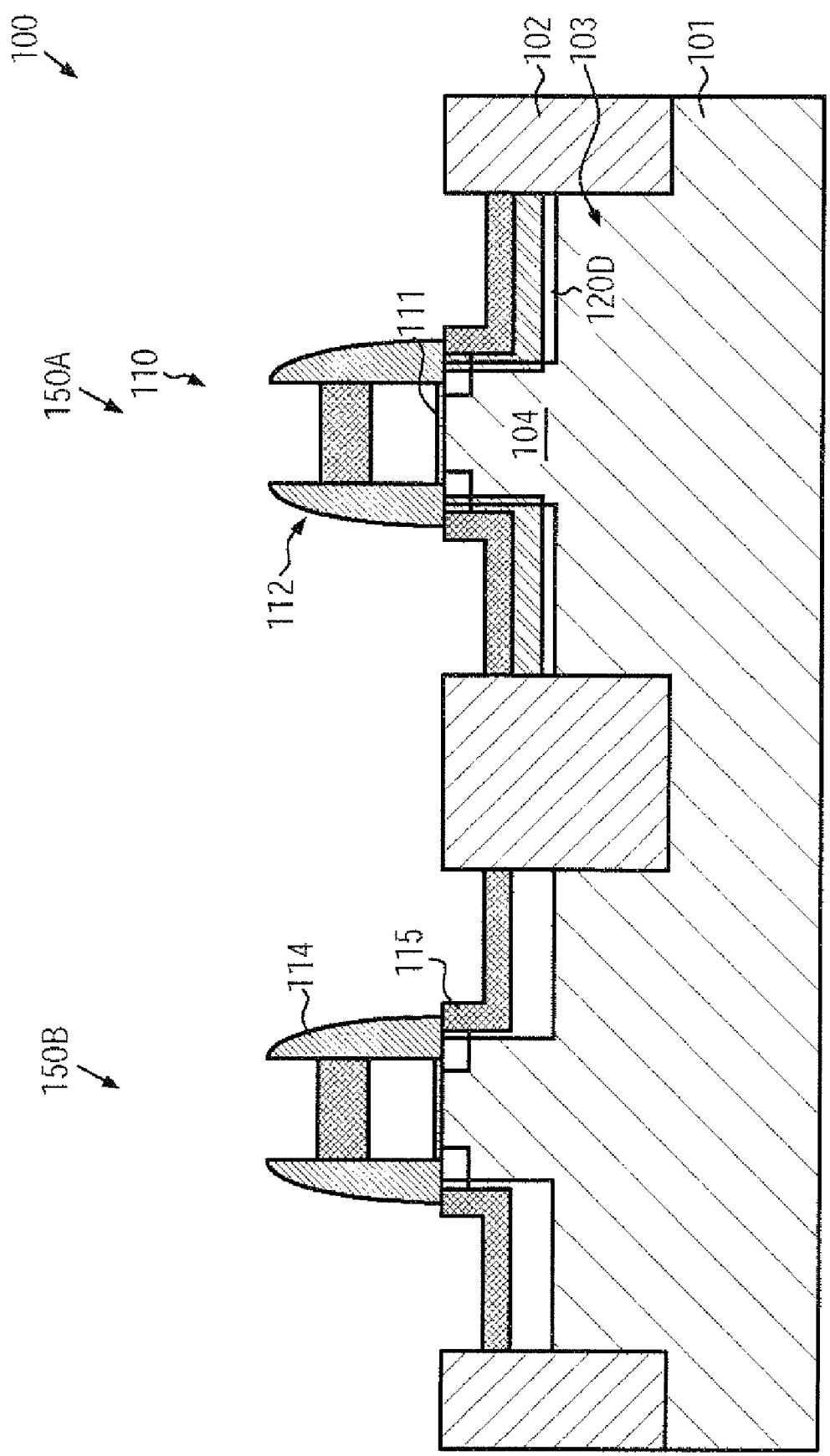
FIGS. 1g-1h schematically illustrate cross-sectional views of the semiconductor device in advanced manufacturing stages in which the basic transistor configurations may be completed on the basis of a silicidation process performed for gate electrode structures and the drain and source regions in a common process, followed by the deposition of appropriate strain-inducing dielectric materials, according to illustrative embodiments.
Figure 1H:
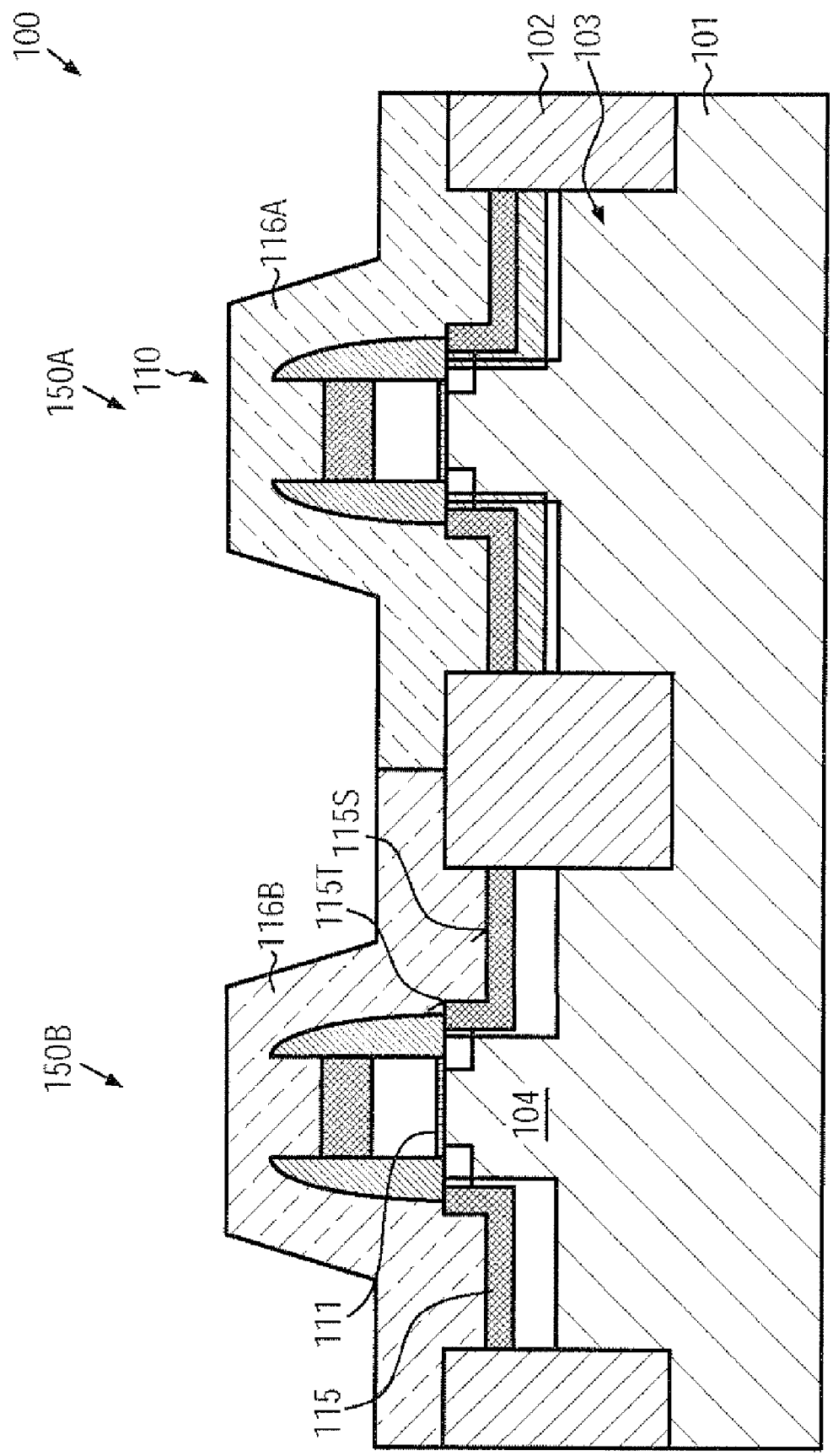

With reference to FIGS. 1g and 1h, illustrative embodiments will now be described in which, starting from the configuration as shown in FIG. 1f, the further processing may be continued by maintaining a substantial portion of the initial gate electrode 112.

FIG. 1g schematically illustrates the semiconductor device 100 in a further advanced manufacturing stage in which metal silicide regions 115 may be formed in the drain and source regions 120 and an upper portion of the gate electrodes 112. In this case, the metal silicide regions 115 may be formed in a common manufacturing sequence, which may include well-established wet chemical etch recipes for preparing exposed surface portions for receiving a metal, such as nickel, cobalt, platinum and the like, which may then be converted into a metal silicide by applying appropriate heat treatment. During the wet chemical cleaning processes, the intermediate dielectric layer 112C (FIG. 1f) formed on top of the portion 112A may be removed, thereby exposing the portion 112A. In other cases, a specifically designed etch stop may be applied to remove the layer 112C without unduly affecting other exposed surface portions. Consequently, well-established silicidation techniques may be used for commonly providing the regions 115 in the gate electrodes 112 and the drain and source regions 120. Thereafter, the further processing may be continued by depositing highly stressed dielectric materials in order to further enhance overall transistor performance, as previously explained.

FIG. 1h schematically illustrates the device 100 with a first strain-inducing dielectric material 116A formed above the first transistor 150A, and with a second strain-inducing material 116B formed above the second transistor 150B. In the embodiment shown, the first strain-inducing dielectric material 116A may be provided with high internal compressive stress so as to further enhance the strain component provided by the strained semiconductor alloy 107. It should be appreciated, however, that any other configuration may be selected, depending on the overall process strategy. That is, if the semiconductor alloy 107 may provide a tensile strain component in the channel region 104, the first dielectric layer 116A may be provided with high internal tensile stress so as to further enhance the overall charge carrier mobility in the channel region 104. In still other cases, the layer 116A may be provided as a substantially stress-neutral layer if the performance enhancing effect of the strained semiconductor alloy 107 may be considered appropriate, thereby reducing overall process complexity in providing the layers 116A, 116B. Furthermore, in the embodiment shown, the second layer 116B may comprise a high internal tensile stress, thereby enhancing performance of the transistor 150B when representing a P-channel transistor.

The strain-inducing dielectric materials 116A, 116B may be formed on the basis of well-established process techniques, including the deposition of a highly stressed dielectric material, for instance the material 116A, which may be accomplished on the basis of PECVD techniques, in which deposition parameters may be selected so as to obtain a high internal stress level of up to 2 GPa or higher. Thereafter, a portion of the material 116A provided above the transistor 150B may be removed by appropriate masking techniques and etch processes and thereafter the material 116B may be deposited and may partially be removed from above the transistor 150A. During the deposition of the material 116B, corresponding deposition parameters may be selected so as to obtain the desired stress level, such as a tensile stress of up to 1 GPa or higher, depending on the overall process strategy. As previously explained, a layer thickness of the materials 116A, 116B may have to be adapted with respect to the overall device geometry and the gap fill capabilities of the corresponding deposition techniques. Hence, the reduced height of the gate electrodes 112 may provide a relaxed overall surface topography, while recesses 120R may enable the deposition of the highly stressed materials 116A, 116B at a low height level so as to enable a direct lateral stress component acting on the channel regions 104.

Consequently, the transistors 150A, 150B may have an increased amount of highly stressed material in close proximity to the channel regions 104 due to the recesses, while also an increased amount of metal silicide in the regions 115 may be obtained, since an increased surface area provided by the recesses 120R may be available during the silicidation process. Hence, the metal silicide regions 115 may comprise a surface portion 115S that is positioned below a height level defined by the gate insulation layer 111, while additionally a surface portion 115T may be available for charge carrier transport, thereby reducing the overall series resistance compared to conventional planar transistor configurations.

With reference to FIGS. 1i-1l, further illustrative embodiments will now be described in which, starting from the configuration as shown in FIG. 1f, the gate electrode may be replaced by a metal-containing material.

Figure 1I:
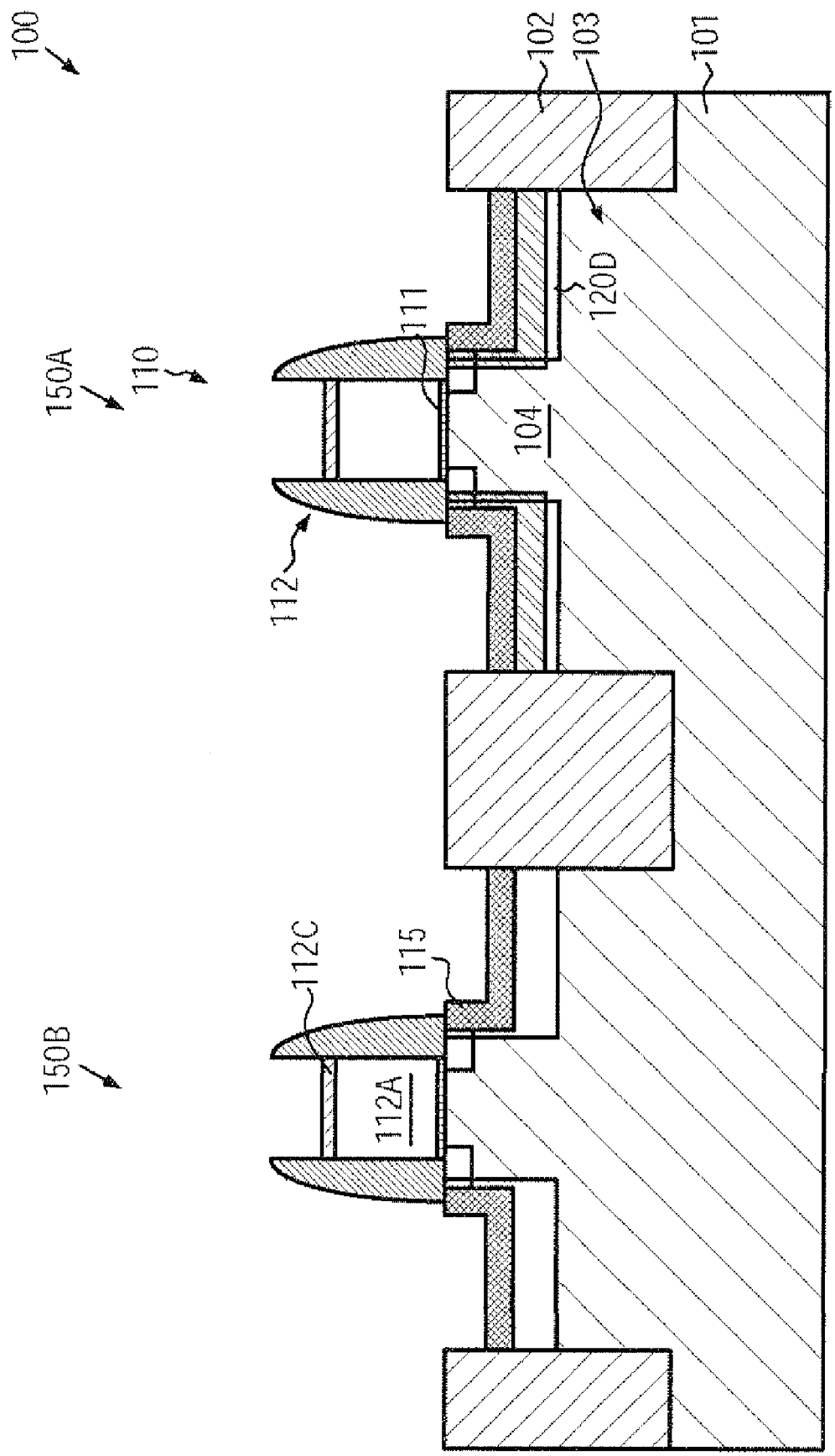

FIG. 1i schematically illustrates the semiconductor device 100 after forming the recesses 120R (FIG. 1f) and with metal silicide regions 115 formed on exposed surface portions of the recesses 120R. For this purpose, well-established silicidation processes may be used, wherein, however, contrary to the previously described embodiments, the intermediate layer 112C may be maintained, at least partially, to act as a silicidation mask. To this end, less aggressive wet chemical etch recipes may be used for cleaning the exposed surface portions of the device 100, when conventional silicon dioxide material or other conventional dielectrics may be used for the intermediate layer 112C. In other illustrative embodiments, a material of increased etch resistivity may be used, such as hafnium oxide, which, in some illustrative embodiments, may also be used for forming the gate insulation layer 111, as previously explained. In other cases, any other appropriate material, such as silicon carbide and the like, may be used in order to obtain enhanced etch resistivity during the wet chemical processes for preparing the device 100 for receiving the metal silicide regions 115. Thereafter, the further processing may be continued by depositing an appropriate portion of an interlayer dielectric material, for instance in the form of highly stressed dielectric materials, as previously explained.

Figure 1J:
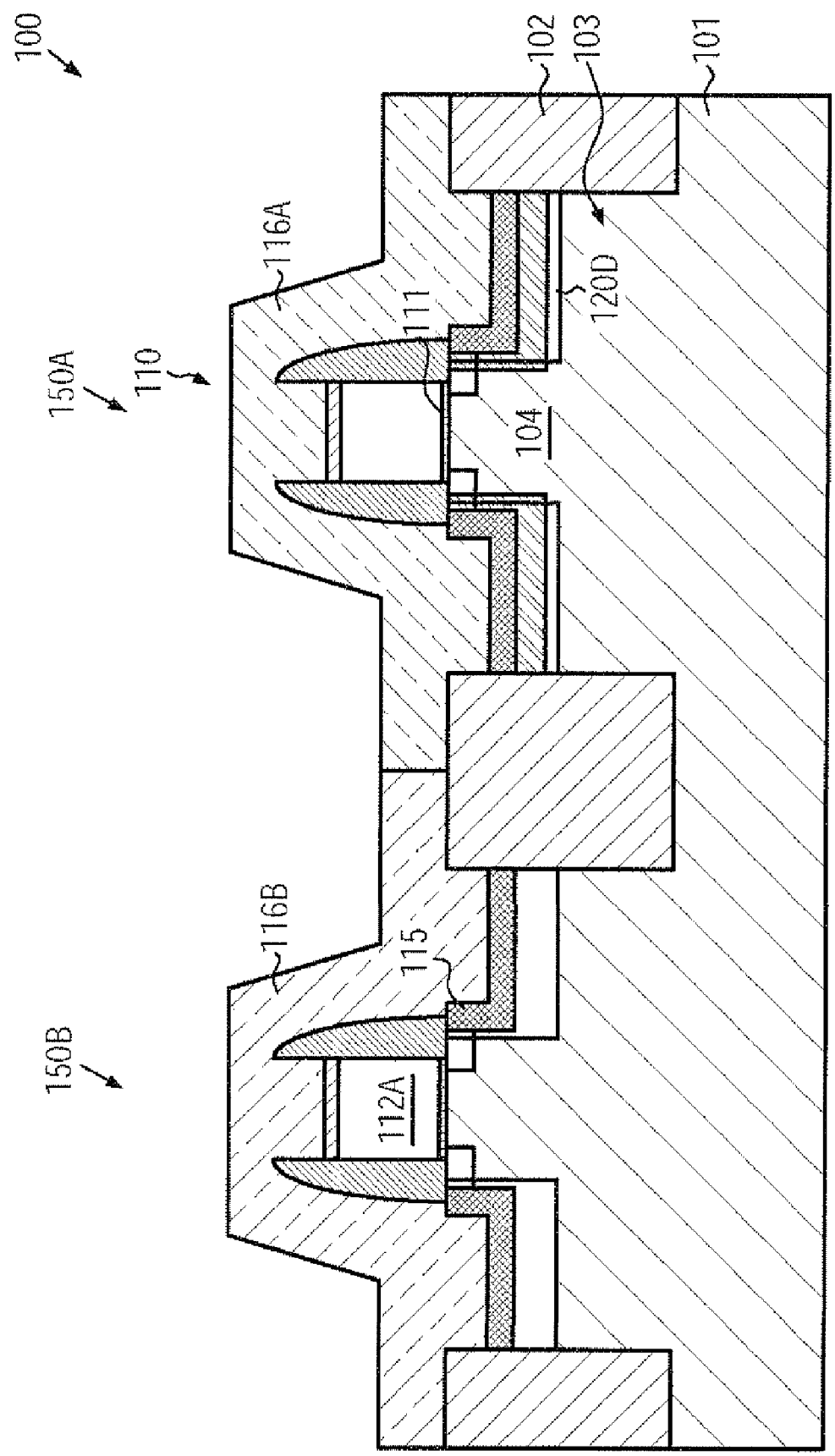

FIG. 1j schematically illustrates the semiconductor device 100 with the strain-inducing materials 116A, 116B formed above the transistors 150A, 150B, respectively. The materials 116A, 116B may be provided on the basis of process techniques as previously described. Thereafter, in some illustrative embodiments, a further material may be deposited, which may exhibit enhanced gap filling capabilities so as to reliably fill any spaces between closely spaced transistor elements, even for sophisticated semiconductor devices in which a spacing of gate electrode structures may be 100 nm and significantly less in densely spaced device areas. For this purpose, well-established techniques and materials may be used, such as silicon dioxide, which may be provided by sub-atmospheric CVD or high density plasma enhanced CVD on the basis of TEOS. In still other illustrative embodiments, an appropriate sacrificial fill material may be provided, which may be replaced by other appropriate material in a later manufacturing stage. The respective fill material may enhance process uniformity during a subsequent planarization step.

Figure 1K:
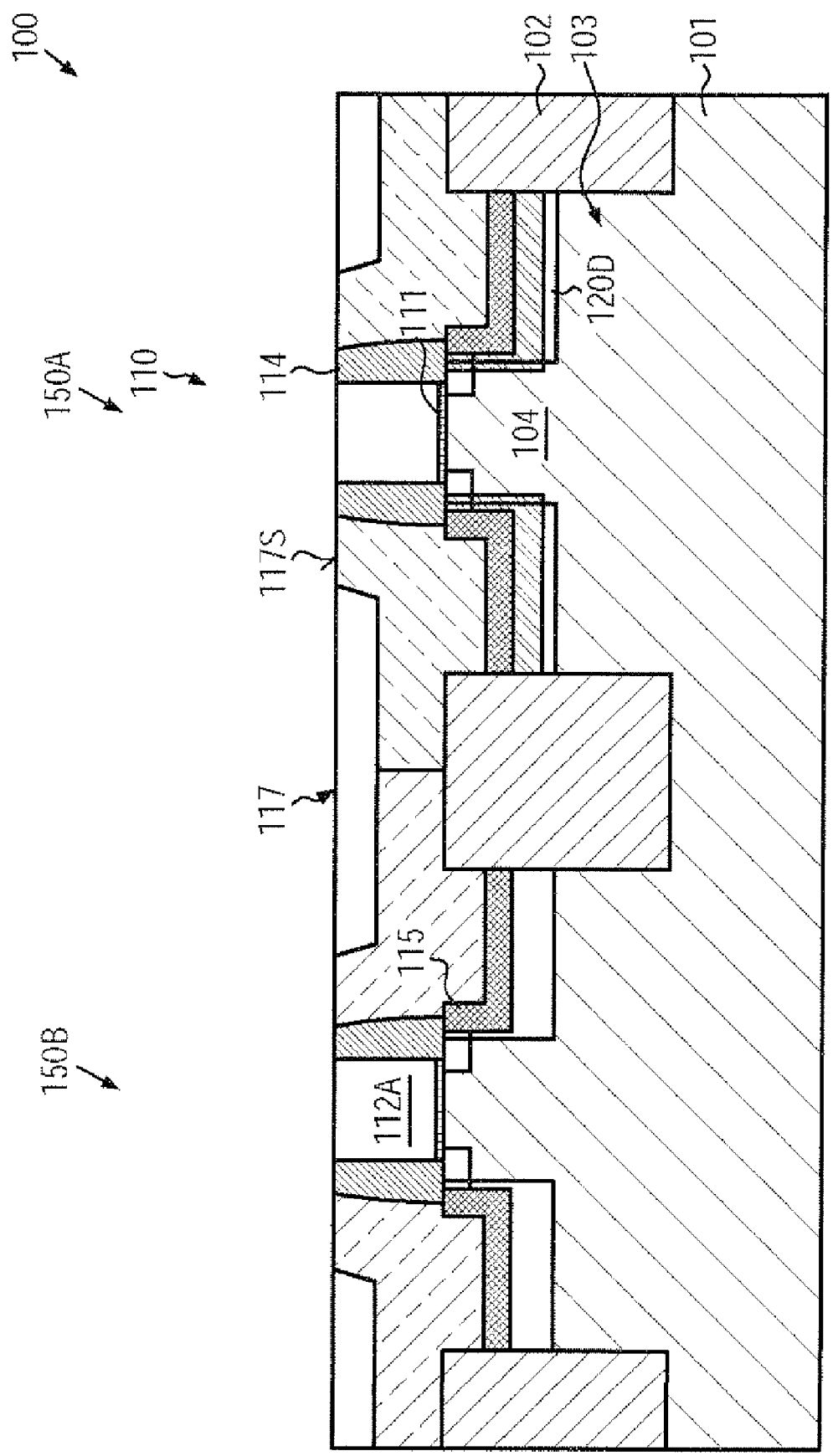
Figure 1I:
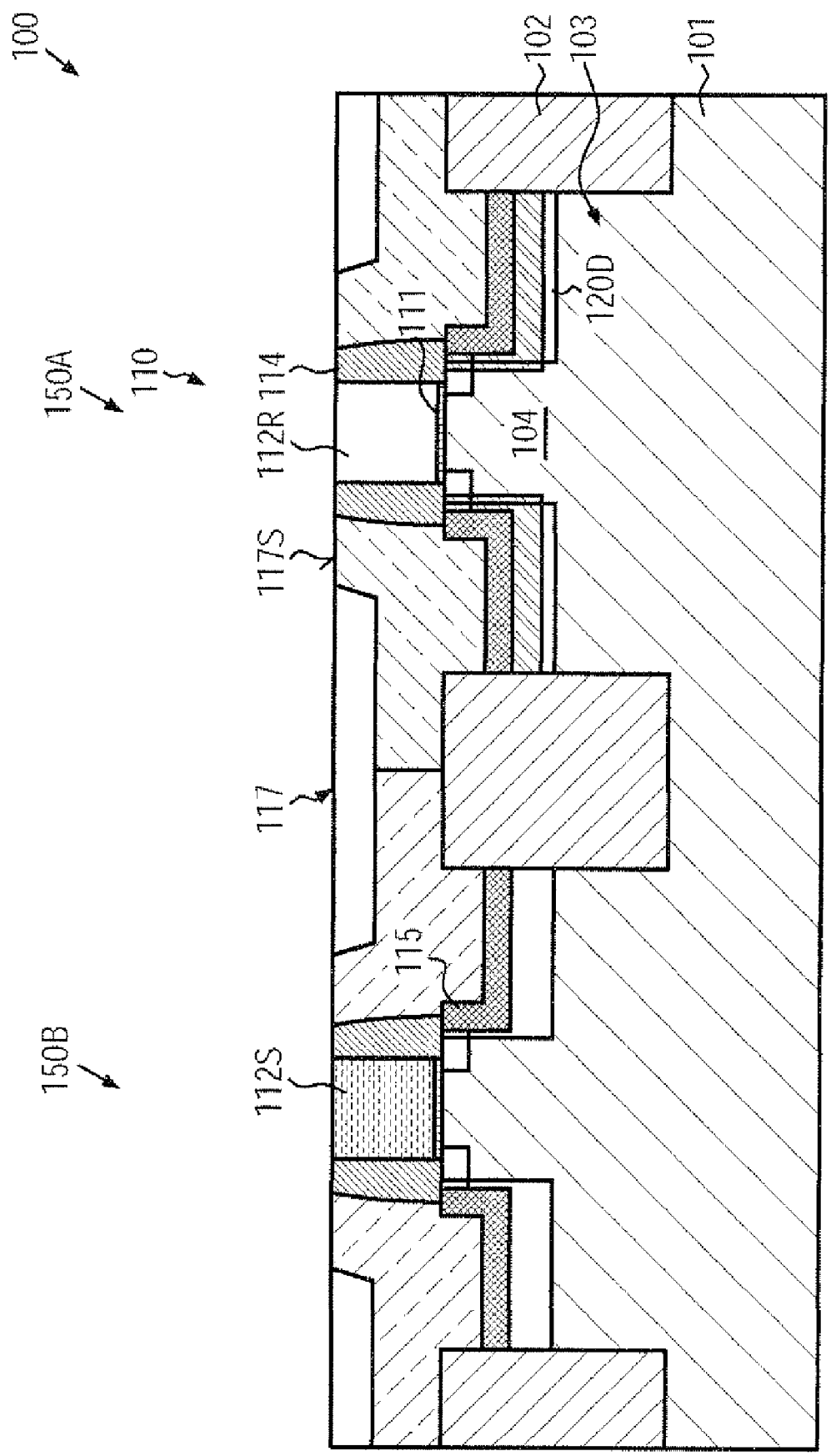

FIG. 1k schematically illustrates the semiconductor device 100 after the above-described process sequence. As illustrated, the semiconductor device 100 may comprise a substantially planarized surface 117S, which may be formed by the materials 116A, 116B (FIG. 1j) and a further dielectric material 117, such as a silicon dioxide material, or any other appropriate fill material that may be deposited with the required gap filling capabilities, as previously explained. Furthermore, the surface 117S may be formed by the remaining portion 112A of the gate electrodes 112 and the spacer structures 114. For this purpose, after the deposition of the material 117, an appropriate planarization technique, such as chemical mechanical polishing (CMP), may be performed on the basis of a substantially non-planarization recipe. During the polishing process, the intermediate layers 112C (FIG. 1i) may be exposed and finally be removed, thereby exposing the gate electrode material of the portion 112A. It should be appreciated that, in other illustrative embodiments, the planarization process may be continued to any desired height level, since gate conductivity may be determined by a highly conductive metal-containing material and thus corresponding reduced cross-sectional areas of the gate electrodes 112 may be acceptable. For example, the planarization process may be continued until a significant portion of the material 117 may be removed, or even until the material 117 may be completely removed, except for any minute residues. Thereafter, the exposed portion 112A may be removed on the basis of an appropriately designed etch step, which may be performed on the basis of hydrogen bromide in order to selectively remove silicon-based material with respect to the surrounding dielectric materials of the layers 116A, 116B, the spacer structure 114 and possibly the material 117. In other illustrative embodiments, the corresponding etch process may be performed on the basis of an appropriate wet chemical recipe, which may provide the desired degree of etch selectivity with respect to the materials of the spacer structure 114 and the materials 116A, 116B. For instance, a solution including TMAH (tetra methyl ammonium hydroxide) may be used, which is typically used as a basis of a photolithography developer material, which also etches silicon when provided in higher concentrations and at higher temperatures. On the other hand, silicon dioxide and silicon nitride are highly resistant to this etch solution. Hence, the corresponding etch process may be efficiently stopped at or in the gate insulation layer 111, which, in some illustrative embodiments, may be comprised of silicon dioxide-based materials, while, in other cases, a high-k dielectric material, such as hafnium oxide, may be used which may also exhibit a desired high etch stop capability with respect to the selective removal of the portion 112A. In some illustrative embodiments, an additional etch step may be performed to selectively remove the gate insulation layer 111 in order to provide a replacement gate dielectric with any appropriate composition. For instance, in this case, any appropriate material and thickness may be selected and may be deposited by any appropriate deposition technique.

It should be appreciated that, in some illustrative embodiments, the replacement of the portions 112A with a metal-containing material may be performed by different process sequences in order to more efficiently adjust the desired work function of the newly created gate electrode material. For this purpose, the etch process for removing the portions 112A in the transistors 150A, 150B may be performed as masked etch processes so that, for instance, a portion 112A of the transistor 150A may be removed while masking the transistor 150B and, thereafter, an appropriate metal-containing material may be deposited, possibly in combination with the deposition of a desired gate dielectric material if the initial gate insulation layer 111 is to be replaced, as previously explained. Thereafter, any excess material may be removed, for instance by CMP, and thereafter a similar process sequence may be performed for replacing the portion 112A of the transistor 150B.

FIG. 1l schematically illustrates the semiconductor device 100 after the above-described process sequence. As shown, the transistor 150A may comprise a replacement gate electrode 112R, which may be formed of any appropriate metal-containing material, such as titanium nitride and the like, in which the material characteristics are adjusted such that a desired work function is obtained, which, in turn, in combination with the previously performed implantation processes, may appropriately adjust the threshold voltage of the transistor 150A. On the other hand, the transistor 150B may comprise a replacement gate electrode 112S, which may also be comprised of a metal-containing material having an appropriate work function for the transistor 150B. As previously explained, prior to providing the replacement gates 112R, 112S, appropriate gate insulation layers may be provided, if desired. In other cases, the initial gate insulation layer 111 may be provided as a high-k dielectric material, depending on the overall process strategy. Furthermore, in some illustrative embodiments, the initial gate electrode 112, that is, the portion 112A, may be maintained in one of the transistors 150A, 150B, while the corresponding replacement gate electrode 112R, 112S may be formed in the other one of the transistors 150A, 150B. Similarly, the replacement gate electrodes 112R, 112S may be provided for the transistors 150A, 150B, while, in other device areas, the initial gate electrode 112, i.e., the portion 112A, may be maintained. It should be appreciated that in illustrative embodiments in which the gate insulation layer 111 may be replaced prior to providing the replacement gate electrodes 112R, 112S, in a further process step, a portion of the electrodes 112R, 112S may be removed and may be replaced by a common metal so as to provide a continuous electrical connection of polysilicon lines, which may cross a P-active region and an N-active region, which may otherwise be interrupted by the replacement gate dielectric provided prior to the deposition of the replacement gate electrode materials 112R, 112S.

In some illustrative embodiments, the further processing may be continued by depositing an interlayer dielectric material, for instance in the form of silicon dioxide, according to well-established recipes. In other cases, a further stress-inducing material may be provided, for instance, selectively for the transistors 150A, 150B, thereby further enhancing transistor performance thereof. Due to the planarized surface topography, a corresponding patterning regime may be provided without being restricted by the original surface topography of the device 100. For example, as previously indicated, a height of the replacement gates 112R, 112S may be selected at a moderately low value so that the material 117 may be substantially removed during the planarization process, thereby providing the possibility of positioning additional highly stressed dielectric material closely to the basic transistor structures.

As a result, the present disclosure provides semiconductor devices and manufacturing techniques in which a plurality of performance-enhancing mechanisms may be efficiently combined while maintaining compatibility with the early provision of the strain-inducing semiconductor alloy 107. That is, after the epitaxial growth of the semiconductor alloy 107, a recessed transistor configuration may be obtained while also maintaining a desired high gate electrode height during the implantation processes for defining the drain and source regions. Thereafter, the resulting gate height may be reduced in accordance with device requirements, wherein the specific configuration of the gate stack may provide enhanced overall process efficiency during the formation of metal silicide and/or during the replacement of the initially provided gate electrode material by a metal-containing electrode material. Consequently, the advantages of a recessed transistor configuration may be efficiently combined with the advantages of a semiconductor alloy formed in an early manufacturing stage, while enhanced flexibility may also be achieved with respect to replacing polysilicon materials with highly conductive metal-containing electrode materials, possibly in combination with high-k dielectrics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode structure above a silicon-containing semiconductor region, said gate electrode structure comprising a cap layer, a first etch stop layer located below said cap layer, a first polycrystalline silicon layer located below said first etch stop layer, and a second etch stop layer located below said first polycrystalline silicon layer;
    forming a strain-inducing semiconductor alloy in recesses in said silicon-containing semiconductor region laterally offset from said gate electrode structure;
    forming drain and source regions in said semiconductor region and said semiconductor alloy;
    removing said cap layer and said first etch stop layer;
    removing material of said strain-inducing semiconductor alloy so as to recess said drain and source regions and removing material of said gate electrode structure including at least said first polycrystalline silicon layer to reduce a height of said gate electrode structure using said second etch stop layer as an etch stop; and forming a strain-inducing layer above said drain and source regions.

2. The method of claim 1, wherein forming said strain-inducing semiconductor alloy comprises forming a spacer element on sidewalls of said gate electrode structure, forming said recesses in the presence of said spacer element and removing said spacer element and said cap layer after forming said strain-inducing semiconductor alloy in a common etch process.

3. The method of claim 1, further comprising forming a gate insulation layer of said gate electrode structure on the basis of a high-k dielectric material.

4. The method of claim 1, wherein forming said gate electrode structure comprises forming at least one of said first and second etch stop layers on the basis of a high-k dielectric material.

5. The method of claim 1, further comprising forming a metal-containing material in said gate electrode structure prior to forming said strain-inducing layer.

6. The method of claim 1, further comprising forming a metal-containing material in said gate electrode structure after forming said strain-inducing layer.

7. The method of claim 6, further comprising forming metal silicide regions in said drain and source regions and using said second etch stop layer as a mask layer.

8. The method of claim 7, wherein the strain inducing layer is also formed above the gate electrode material and wherein forming said metal containing material in said gate electrode structure comprises removing material of said strain inducing layer so as to expose the gate electrode material and replacing said gate electrode material with said metal containing material.

9. The method of claim 8, further comprising forming a further strain-inducing material above said metal-containing material of said gate electrode structure.

10. A method, comprising:
    forming drain and source regions of a first transistor in a semiconductor layer adjacent to a first gate electrode having formed on sidewalls thereof a first spacer structure, said drain and source regions of said first transistor comprising a strain-inducing semiconductor alloy;
    forming drain and source regions of a second transistor adjacent to a second gate electrode having formed on sidewalls thereof a second spacer structure;
    forming recesses in the drain and source regions of said first and second transistors and removing a portion of said first and second gate electrodes in a common etch process;
    replacing said first gate electrode by a first metal-containing electrode material and replacing said second gate electrode by a second metal-containing electrode material, wherein said first and second metal-containing electrode materials have different work functions; and
    forming a first strain-inducing material above the drain and source regions of said first transistor and forming a second strain-inducing material above the drain and source regions of said second transistor, said first and second strain-inducing materials generating a different type of strain.

11. The method of claim 10, further comprising forming a gate insulation layer of said first and second transistors on the basis of a high-k dielectric material.

12. The method of claim 11, further comprising forming a plurality of dielectric layers in said first and second gate electrodes.

13. The method of claim 12, wherein at least one of said plurality of dielectric layers is formed on the basis of a high-k dielectric material.

14. The method of claim 10, further comprising forming metal silicide regions in said drain and source regions of the first and second transistors and in said first and second gate electrodes in a common process.

* * * * *